United States Patent
Yao et al.

(10) Patent No.: US 7,880,182 B2
(45) Date of Patent: Feb. 1, 2011

(54) LIGHT-EMITTING ELEMENT ARRAY

(75) Inventors: Chiu-Lin Yao, Hsinchu (TW);
Min-Hsun Hsieh, Hsinchu (TW);
Wen-Huang Liu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 41 days.

(21) Appl. No.: 12/482,419

(22) Filed: Jun. 10, 2009

(65) Prior Publication Data
US 2009/0302334 A1    Dec. 10, 2009

Related U.S. Application Data

(63) Continuation-in-part of application No. 10/906,894, filed on Mar. 11, 2005, now Pat. No. 7,560,738, which is a continuation-in-part of application No. 10/604,245, filed on Jul. 4, 2003, now Pat. No. 6,987,287.

(30) Foreign Application Priority Data

Jul. 15, 2002   (TW) ............... 91114688 A
Apr. 13, 2004   (TW) ............... 93110342 A (51) Int. Cl.
*H01L 29/88* (2006.01)
(52) U.S. Cl. ............... 257/88; 257/93; 257/96; 257/E33.071

(58) Field of Classification Search ............. 257/88, 257/93, 96, E33.071
See application file for complete search history.

(56) References Cited

U.S. PATENT DOCUMENTS

| | | | |
|---|---|---|---|
| 6,547,249 B2 | 4/2003 | Collins, III et al. | |
| 7,560,738 B2 * | 7/2009 | Liu ............................. | 257/88 |
| 2003/0178627 A1 * | 9/2003 | Marchl et al. ................ | 257/80 |
| 2004/0007709 A1 * | 1/2004 | Kondo ......................... | 257/80 |
| 2004/0164311 A1 * | 8/2004 | Uemura ....................... | 257/99 |

* cited by examiner

*Primary Examiner*—Fernando L Toledo (57) ABSTRACT

A light-emitting element array includes a conductive substrate; an adhesive layer disposed on the conductive substrate; a first epitaxial light-emitting stack layers disposed on the adhesive layer, the first epitaxial light-emitting stack layers including a first p-contact and an first n-contact, wherein the first p-contact and the first n-contact are disposed on the same side of the first epitaxial light-emitting stack layer; and a second epitaxial light-emitting stack layers disposed on the adhesive layer including a second p-contact and an second n-contact, wherein the second p-contact and the second n-contact are disposed on the opposite side of the epitaxial light-emitting stack layer; wherein the first epitaxial light-emitting stack layers and the second epitaxial light-emitting stack layers are electrically connected in anti-parallel.

8 Claims, 7 Drawing Sheets

LIGHT-EMITTING ELEMENT ARRAY

CROSS REFERENCE TO RELATED APPLICATIONS

This is a continuation-in-part of application Ser. No. 10/906,894, filed Mar. 11, 2005, which is incorporated in its entirety herein by reference.

BACKGROUND OF THE DISCLOSURE

1. Technical Field

The present invention relates to a light-emitting device, and more particularly, to a light-emitting element array having an adhesive layer.

2. Description of the Related Art

Light-emitting diodes (LEDs) are employed in a wide variety of applications including optical display devices, traffic lights, data storage equipment, communications devices, illumination apparatuses, and medical treatment equipment. One of the most important goals of engineers who design LEDs is to increase the brightness of the light emitted.

U.S. Pat. No. 6,547,249 discloses monolithic serial/parallel LED arrays formed on highly resistive substrates. According to the patent, a Group III-V nitride light-emitting stack layer is formed on an insulating substrate. A portion of the stack layer is etched away to form a trench, and in result to form the LED array, which includes a plurality of light-emitting diodes divided by the trench. Since the insulating substrate is not conductive, both P-contacts and N-contacts for the LED array have to be formed on the same side of the LED array. In use, two LED arrays can be connected either in series or in parallel. However, the LED array disclosed by the patent cannot be applied to a quaternary AlInGaP light-emitting diode, which comprises a conductive substrate rather than an insulating substrate, P-contacts formed on one side of the conductive substrate, and N-contacts having to be formed on the other side. Therefore, two quaternary Al—In—Ga—P light-emitting diode arrays can be connected neither in series nor in parallel. Moreover, as the size of the LED array become larger, the operating voltage of the LED array becomes higher accordingly, and heat dissipation becomes an important concern for the LED array.

SUMMARY OF THE DISCLOSURE

Accordingly, this disclosure provides a light-emitting element array comprising a conductive substrate; an adhesive layer disposed on the conductive substrate; a first epitaxial light-emitting stack layers disposed on the adhesive layer, the first epitaxial light-emitting stack layers comprising a first contact and an second contact, wherein the first contact and the second contact are disposed on the same side of the first epitaxial light-emitting stack layer; and a second epitaxial light-emitting stack layers disposed on the adhesive layer, the second epitaxial light-emitting stack layers comprising a third contact and an fourth contact, wherein the third contact and the fourth contact are disposed on the opposite side of the epitaxial light-emitting stack layer; wherein the first epitaxial light-emitting stack layers and the second epitaxial light-emitting stack layers are electrically connected in anti-parallel.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Reference will now be made in detail to the preferred embodiments of the present disclosure, examples of which are illustrated in the accompanying drawings. Wherever possible, the same reference numbers are used in the drawings and the description to refer to the same or like parts.

Figure 1:
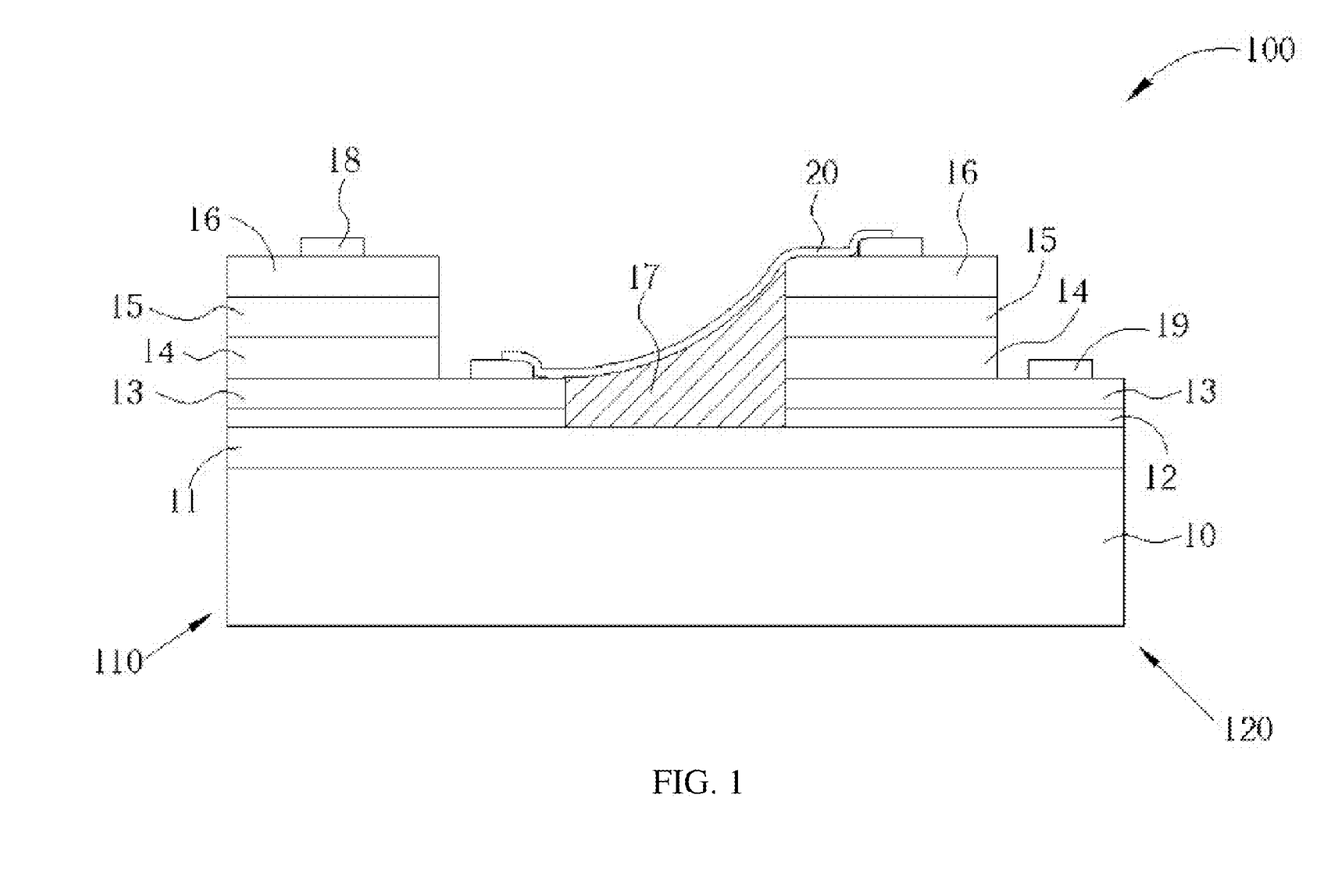
FIG. 1 is a cross sectional schematic diagram of a light-emitting diode array having an adhesive layer of the preferred embodiment according to the present invention.

Please refer to FIG. 1, which is a cross sectional schematic diagram of a light-emitting diode array 100 of the preferred embodiment according to the present invention. The LED array 100 comprises a substrate 10, a reflective layer 11 formed on the substrate 10, an insulating transparent adhesive layer 12 formed on the reflective layer 11, a transparent conductive layer 13 formed on the insulating transparent adhesive layer 12, a first conductive semiconductor stack layer 14 formed on the transparent conductive layer 13, a light-emitting layer 15 formed on the first conductive semiconductor stack layer 14, a second conductive semiconductor stack layer 16 formed on the light-emitting layer 15.

A trench is formed by etching away a portion of the second conductive semiconductor stack layer 16, the light-emitting layer 15, the first conductive semiconductor stack layer 14, the transparent conductive layer 13, and the insulating transparent adhesive layer 12 sequentially, and therefore the LED array 100 is divided into a first LED 110 and a second LED 120, both of which have the substrate 10 in common. Moreover, a transparent conductive layer exposed surface region is formed by etching both of the first LED 110 and the second LED 120 moderately to the transparent conductive layer 13. The LED array 100 further comprises an insulating layer 17 formed surrounding the first LED 110 and the second LED 120 for electrically isolating the first LED 110 from the second LED 120. First contacts 18 formed on the second conductive semiconductor stack layer 16 of the first LED 110 and the second conductive semiconductor stack layer 16 of the second LED 120 respectively. Second contacts 19 formed on the transparent conductive layer exposed surface region of the first LED 110 and the transparent conductive layer exposed surface region of the second LED 120 respectively, and a conductive line for electrically connecting a second contact of the first LED 110 to a first contact of the second LED 120.

Figure 2:
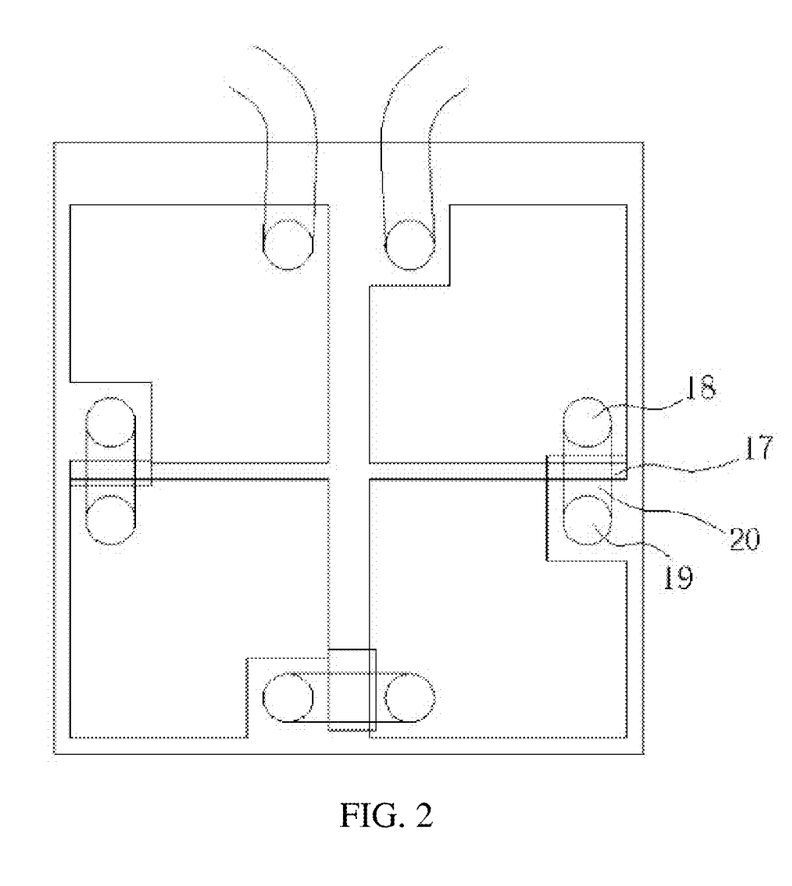
FIG. 2 is a top view of a schematic diagram of a plurality of serially connected LED arrays shown in FIG. 1 according to the present invention.
Figure 3:
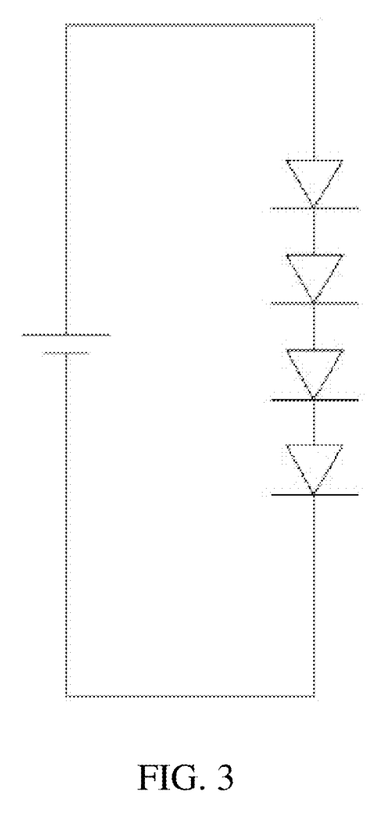
FIG. 3 is an equivalent circuit diagram of the LED arrays shown in FIG. 2 according to the present invention.
Figure 4:
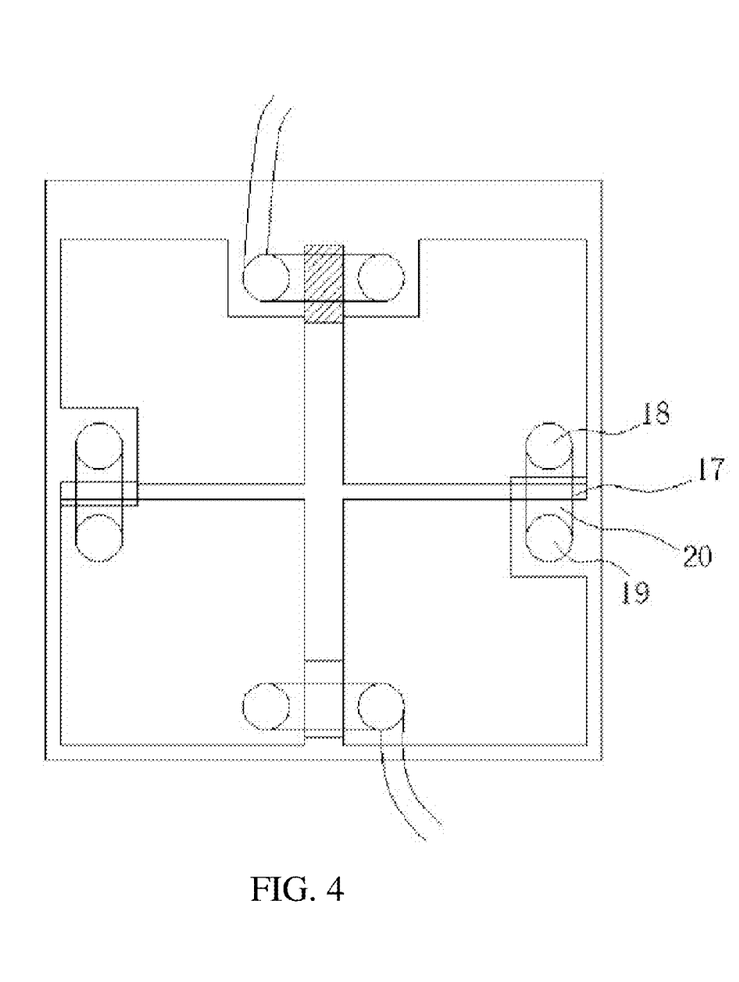
FIG. 4 is a top view of a schematic diagram of a plurality of serially and parallelly connected LED arrays shown in FIG. 1 according to the present invention.
Figure 5:
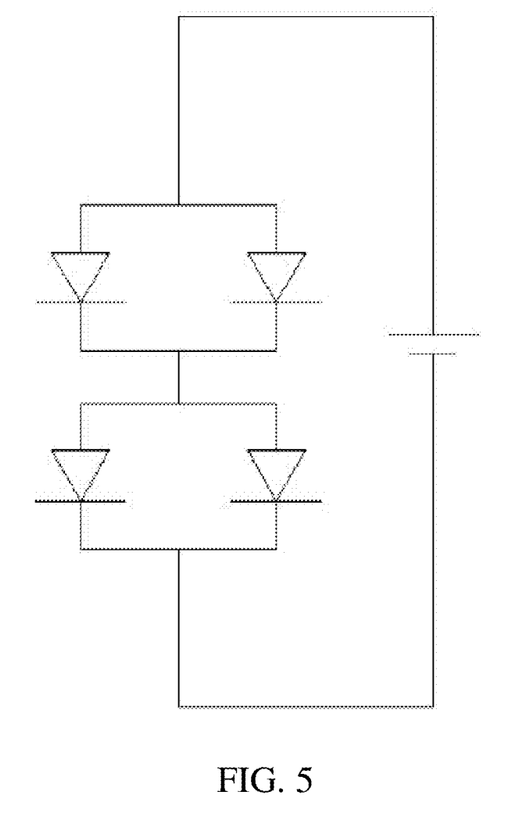
FIG. 5 is an equivalent circuit diagram of the LED arrays shown in FIG. 4 according to the present invention.

FIG. 2 is a top view of a schematic diagram of a plurality of LED arrays 100 connected in series according to the present invention. FIG. 3 is an equivalent circuit diagram of the LED arrays shown in FIG. 2. FIG. 4 is a top view of a schematic diagram of a plurality of LED arrays 100 connected in series and in parallel according to the present invention. FIG. 5 is an equivalent circuit diagram of the LED arrays shown in FIG. 4.

The reflective layer 11 can be also formed between the transparent conductive layer 13 and the adhesive layer 12. The reflective layer 11 is installed to increase the luminance of the LED array 100 by reflecting light projected onto the substrate 10. However, the LED array 100 still can operate without the reflective layer 11.

The insulating transparent adhesive layer 12 is installed to electrically isolate the first LED 110 and the second LED 120 from the substrate 10. The insulating transparent adhesive layer 12 can be replaced by a conductive adhesive layer made of metal or solder. However, an insulating layer providing electrical isolation has to be installed additionally between the substrate 10 and the conductive adhesive layer 12 or between the conductive adhesive layer 12 and the transparent conductive layer 13 to electrically isolate the first LED 110 and the second LED 120 from the substrate 10.

The trench together with the insulating layer 17 electrically isolates the first LED 110 from the second LED 120. However, the LED array 100 can further comprise an ion-implanted region formed between the first LED 110 and the second LED 120 for electrically isolating the first LED 110 from the second LED 120.

The substrate 10 comprises at least one material selected from a material group consisting of GaP, GaAs, Si, SiC, Al2O3, glass, quartz, GaAsP, AlN, metal, and AlGaAs. The insulating transparent adhesive layer 12 comprises at least one material selected from a material group consisting of polyimide (PI), benzocyclobutene (BCB), and perfluorocyclobutene (PFCB). The reflective layer 11 comprises at least one material selected from a material group consisting of In, Sn, Al, Au, Pt, Zn, Ge, Ag, Ti, Pb, Pd, Cu, AuBe, AuGe, Ni, PbSn, AuZn, and indium-tin oxide (ITO). The light-emitting layer 15 comprises at least one material selected from a material group consisting of AlGaInP, GaN, InGaN, AlInGaN, and ZnSe. The transparent conductive layer 13 comprises at least one material selected from a material group consisting of indium-tin oxide (ITO), cadmium-tin oxide (CTO), antimony-tin oxide (ATO), zinc oxide, and zinc-tin oxide. The insulating layer 17 comprises at least one material selected from a material group consisting of SiO2 and SiNx. The first conductive semiconductor stack layer 14 comprises at least one material selected from a material group consisting of AlInP, AlN, GaN, InGaN, AlGaN, and AlInGaN. The second conductive semiconductor stack layer 16 comprises at least one material selected from a material group consisting of AlInP, AlN, GaN, InGaN, AlGaN, and AlInGaN.

Since the insulating transparent adhesive layer 12 has a high resistance and is capable of electrically isolating the substrate 10 from the first LED 110 and the second LED 120 when being installed between them, the first LED 110 and the second LED 120 can comprise not only a Group III-V nitride material, but also a quaternary material. Moreover, since the substrate 10 is electrically isolated from the LEDs 110 and 120, the substrate 10 can be an insulating substrate, a substrate having a high resistance, a conductive substrate, or a substrate having a high thermal conductivity, which has a capability to improve the heat-dissipation efficiency of the LED array 100.

Figure 6:
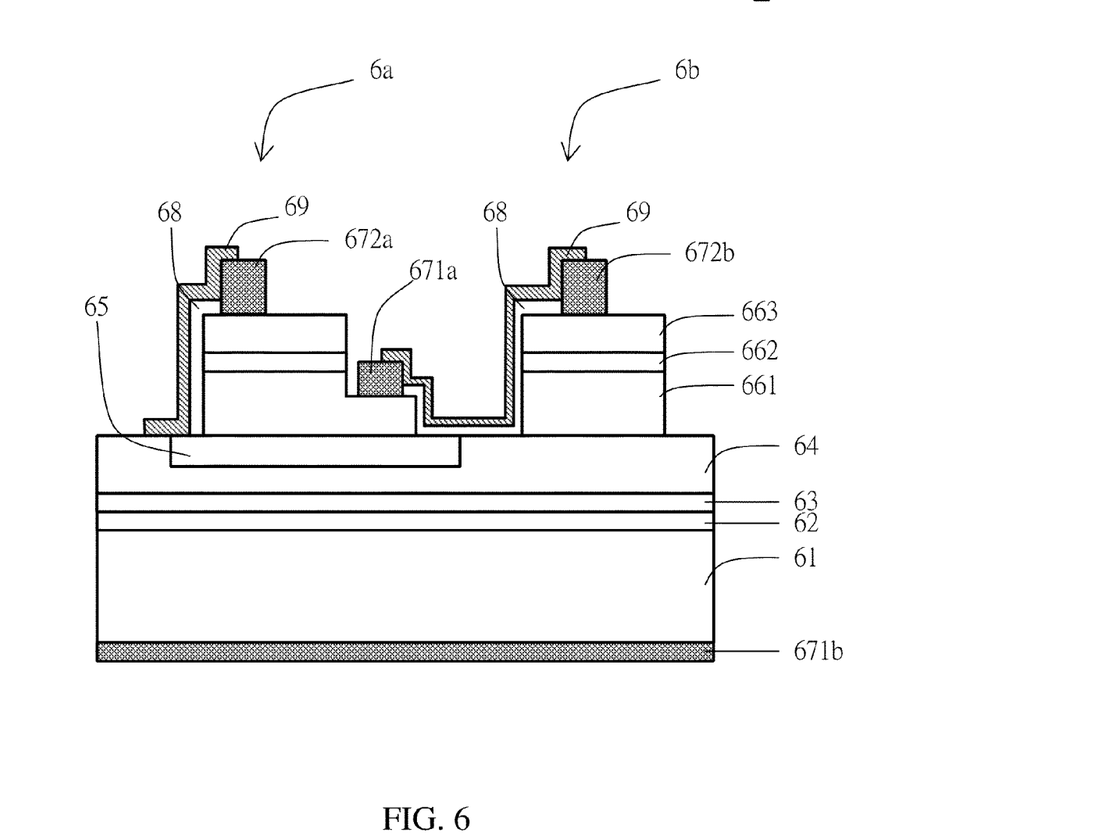
FIG. 6 is a cross sectional schematic diagram of a light-emitting element array of the embodiment according to the present invention.
Figure 7:
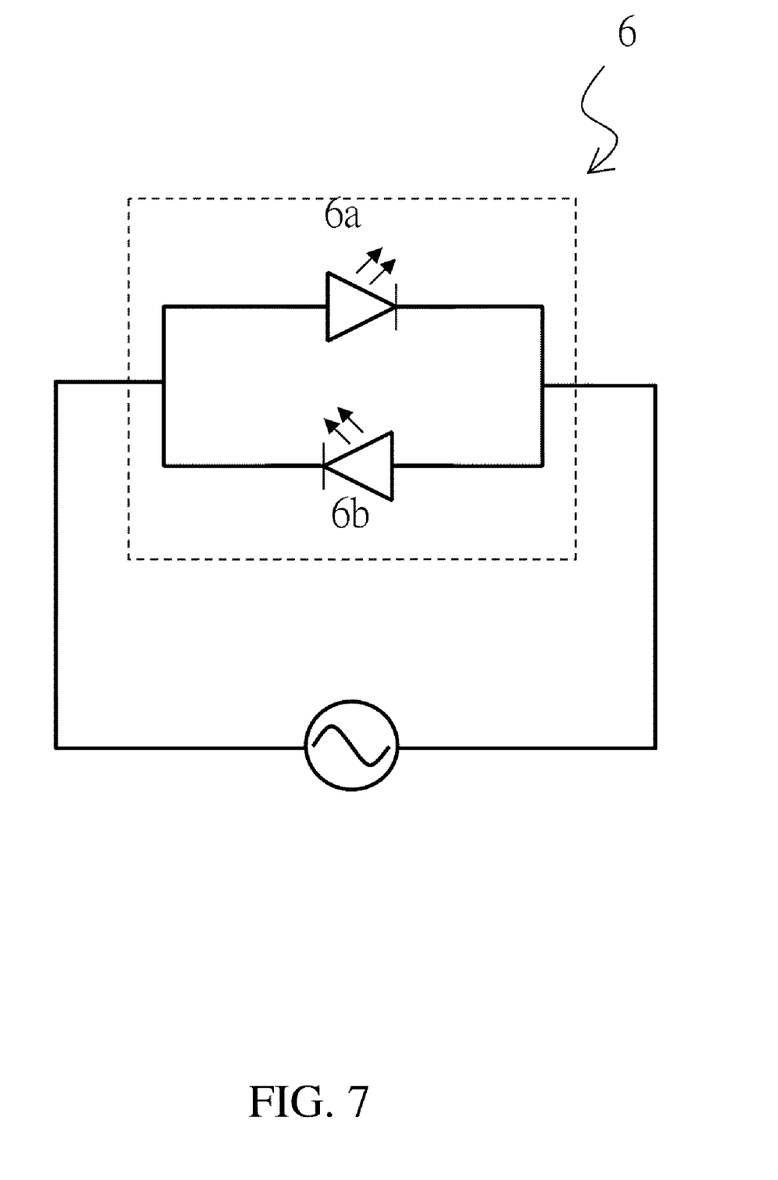
FIG. 7 is an equivalent circuit diagram of the light-emitting element array shown in FIG. 6 according to the present invention.

Referring to FIGS. 6-7, the cross-sectional views show a light-emitting element array 6 in accordance with a second embodiment of the present invention. The light-emitting element array 6 such as an LED array comprises a conductive substrate 61, an adhesive layer 62 formed on the conductive substrate 61, a reflective layer 63 formed on the adhesive layer 62, a transparent conductive layer 64 formed on the reflective layer 63, a first conductive semiconductor stack layer 661 formed on the transparent conductive layer 64, a light-emitting layer 662 formed on the first conductive semiconductor stack layer 661, a second conductive semiconductor stack layer 663 formed on the light-emitting layer 662. In this embodiment, the first conductive semiconductor stack layer 661 is a p-type semiconductor layer, and the second conductive semiconductor stack layer 663 is an n-type semiconductor layer. The conductive substrate 61 comprises at least one material selected from a group consisting of GaP, GaAs, Si, SiC, GaAsP, AlN, metal, and AlGaAs.

Next, a trench is formed by etching away a portion of the second conductive semiconductor stack layer 663, the light-emitting layer 662, and the first conductive semiconductor stack layer 661 sequentially, and therefore the light-emitting element array 6 is divided into a first light-emitting element 6a and a second light-emitting element 6b, both of which have the conductive substrate 61 in common. Before forming the first conductive semiconductor stack layer 661, an insulating layer 65 is formed below the first light-emitting element 6a and on part of the transparent conductive layer 64 to isolate the first light-emitting element 6a and the transparent conductive layer 64. Moreover, a first conductive semiconductor stack layer exposed surface region is formed by partially etching from the second conductive semiconductor stack layer 663 and the light-emitting layer 662 to the first conductive semiconductor stack layer 661. The light-emitting element array 6 further comprises an insulating layer 68 formed between the first light-emitting element 6a and the second light-emitting element 6b for electrically isolating the first light-emitting element 6a from the second light-emitting element 6b. Next, first contacts 671a and 671b are formed on the first conductive semiconductor stack layer 661 of the first light-emitting element 6a and the lower surface of the conductive substrate respectively. Second contacts 672a and 672b are formed on the second conductive semiconductor stack layer 663 of the first light-emitting element 6a and the second conductive semiconductor stack layer 663 of the second light-emitting element 6b respectively.

The transparent conductive layer 64 ohmically contacts with the first conductive semiconductor stack layer 661 of the second light-emitting element 6b. A first conductive line 69 is formed on the insulating layer 68 and connects the first contact 671a of the first light-emitting element 6a and the second contact 672b of the second light-emitting element 6b. A second conductive line 69 is formed on the insulating layer 68 and connects the second contact 672a of the first light-emitting element 6a and the transparent conductive layer 64. FIG. 7 is an equivalent circuit diagram of the light-emitting element array shown in FIG. 6. The first light-emitting element 6a and the second light-emitting element 6b are electrically connected in anti-parallel. The light-emitting element array 6 can be driven by alternating current.

The adhesive layer 62 can be a conductive adhesive layer made of metal in the embodiment. The reflective layer 63 comprises at least one material selected from a material group consisting of In, Sn, Al, Au, Pt, Zn, Ge, Ag, Ti, Pb, Pd, Cu, AuBe, AuGe, Ni, PbSn, AuZn, and multi-layer structure of indium-tin oxide/metal. The light-emitting layer 662 comprises at least one material selected from a material group consisting of AlGaInP, AlInP, GaP, GaN, InGaN, AlInGaN, and ZnSe. The transparent conductive layer 64 comprises at least one material selected from a material group consisting of indium-tin oxide (ITO), cadmium-tin oxide (CTO), antimony-tin oxide (ATO), zinc oxide, and zinc-tin oxide. The insulating layers 65 and 68 comprise at least one material selected from a material group consisting of $SiO_2$ and $SiN_x$. The first conductive semiconductor stack layer 661 comprises at least one material selected from a material group consisting of AlGaInP, GaP, AlInP, AlN, GaN, InGaN, AlGaN, and AlInGaN. The second conductive semiconductor stack layer 663 comprises at least one material selected from a material group consisting of AlGaInP, GaP, AlInP, AlN, GaN, InGaN, AlGaN, and AlInGaN. The first and second contacts 671a, 671b, 672a, 672b are metal contacts.

Those having ordinary skill in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting element array comprising:
   a conductive substrate;
   an adhesive layer disposed on the conductive substrate;
   a first epitaxial light-emitting stack layers disposed on the adhesive layer, the first epitaxial light-emitting stack layers comprising a first contact and an second contact, wherein the first contact and the second contact are disposed on the same side of the first epitaxial light-emitting stack layer; and
   a second epitaxial light-emitting stack layers disposed on the adhesive layer, the second epitaxial light-emitting stack layers comprising a third contact and an fourth contact, wherein the third contact and the fourth contact are disposed on the opposite side of the epitaxial light-emitting stack layer;
   wherein the first epitaxial light-emitting stack layers and the second epitaxial light-emitting stack layers are electrically connected in anti-parallel.

2. The light-emitting element array of claim 1, wherein each of the epitaxial light-emitting stack layers further comprises: a first conductive semiconductor stack layer; a light-emitting layer formed on the first conductive semiconductor stack layer; and a second conductive semiconductor stack layer formed on the light-emitting layer.

3. The light-emitting element array of claim 1 further comprising an insulating region formed between the first and second epitaxial light-emitting stack layers for electrically isolation.

4. The light-emitting element array of claim 1 further comprising a reflective layer formed between the conductive substrate and the epitaxial light-emitting stack layers.

5. The light-emitting element array of claim 1, wherein the adhesive layer is a conductive adhesive layer.

6. The light-emitting element array of claim 5, wherein the conductive adhesive layer is made of metal.

7. The light-emitting element array of claim 1 further comprising an insulating layer disposed between the conductive substrate and the first epitaxial light-emitting stack layers.

8. The light-emitting element array of claim 7 further comprising a conductive line disposed on the insulating layer and electrically connecting the contacts.

* * * * *